(12) United States Patent
Bailey et al.

(10) Patent No.: US 12,288,696 B2
(45) Date of Patent: Apr. 29, 2025

(54) MODULAR FORELINE SYSTEM

(71) Applicant: Edwards Limited, Burgess Hill (GB)

(72) Inventors: Christopher Mark Bailey, Burgess Hill (GB); Michael Andrew Galtry, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 103 days.

(21) Appl. No.: 18/005,753

(22) PCT Filed: Jul. 22, 2021

(86) PCT No.: PCT/GB2021/051898
§ 371 (c)(1),
(2) Date: Jan. 17, 2023

(87) PCT Pub. No.: WO2022/018449
PCT Pub. Date: Jan. 27, 2022

(65) Prior Publication Data
US 2023/0307253 A1 Sep. 28, 2023

(30) Foreign Application Priority Data
Jul. 24, 2020 (GB) .................................. 2011483

(51) Int. Cl.
*H01L 21/67* (2006.01)
*F16L 9/19* (2006.01)
*F16L 9/22* (2006.01)

(52) U.S. Cl.
CPC .......... *H01L 21/67017* (2013.01); *F16L 9/20* (2013.01); *F16L 9/22* (2013.01)

(58) Field of Classification Search
CPC . F04B 37/02; F04B 37/18; F16L 51/04; F16L 9/20; F16L 9/22
See application file for complete search history.

(56) References Cited

U.S. PATENT DOCUMENTS 5,718,029 A  2/1998  Hung et al.
5,867,881 A  2/1999  Hung et al.
(Continued)

FOREIGN PATENT DOCUMENTS

CN  204006308 U  12/2014
CN  104948868 A  9/2015
(Continued)

OTHER PUBLICATIONS

British Examination Report dated Dec. 23, 2020 and Search Report dated Dec. 22, 2020 for corresponding British Application No. GB2011483.1, 6 pages.
(Continued)

*Primary Examiner* — Umashankar Venkatesan
(74) *Attorney, Agent, or Firm* — Theodore M. Magee; Westman, Champlin & Koehler, P.A.

(57) ABSTRACT

A kit of parts for forming a foreline for coupling a process chamber to a vacuum pumping and/or abatement system, the kit comprising: a plurality of foreline segments; wherein each foreline segment is a pipe that comprises: a first substantially straight end portion; a second substantially straight end portion opposite to the first end portion; and an intermediate portion disposed between the first and second end portions and connected to the first and second end portions by respective bends; the first and second end portions are substantially parallel to each other; the intermediate portion is oblique to the first and second end portions; and the foreline segments are configured to be attached together so as to form a continuous foreline.

15 Claims, 2 Drawing Sheets

(56) References Cited

U.S. PATENT DOCUMENTS

| | | | | |
|---|---|---|---|---|
| 7,264,764 | B2* | 9/2007 | Miura | F16L 9/20 |
| | | | | 264/150 |
| 11,002,386 | B2* | 5/2021 | Silva | F16L 43/00 |
| 2010/0288369 | A1* | 11/2010 | Chang | F16K 51/02 |
| | | | | 137/12 |
| 2019/0162349 | A1 | 5/2019 | Leung et al. | |
| 2022/0307627 | A1* | 9/2022 | Kadobe | F16L 9/20 |

FOREIGN PATENT DOCUMENTS

| | | | |
|---|---|---|---|
| DE | 8811176 | U1 | 12/1988 |
| GB | 256410 | | 8/1926 |
| GB | 2568338 | A | 5/2019 |
| JP | H0237716 | A | 2/1990 |
| JP | H08124866 | A | 5/1996 |
| JP | 2007019525 | A | 7/2010 |
| JP | 2013534987 | A | 11/2015 |
| JP | 2013199669 | A | 12/2015 |
| JP | 2019514222 | A | 5/2019 |
| JP | 2019169625 | | 10/2019 |
| JP | 2003534458 | A | 11/2023 |
| KR | 20000026371 | A | 5/2000 |
| WO | 2019092428 | A1 | 5/2019 |
| WO | 2019229428 | A1 | 5/2019 |
| WO | 2020146278 | A1 | 7/2020 |

OTHER PUBLICATIONS

PCT Notification of Transmittal of the International Search Report and the Written Opinion of the International Searching Authority, or the Declaration and PCT Search Report dated Oct. 15, 2021 for corresponding PCT application Serial No. PCT/GB2021/051898, 5 pages.

PCT Written Opinion dated Oct. 15, 2021 for corresponding PCT application Serial No. PCT/GB2021/051898, 8 pages.

Japanese Notification of Reason for Rejected dated Jan. 9, 2025 for corresponding Japanese application Serial No. 2023-504742, 9 pages.

Taiwanese Office Action (no translation) dated Feb. 13, 2025 and Search Report dated Feb. 12, 2025 for corresponding Taiwanese application Serial No. 110127203, 16 pages.

* cited by examiner

MODULAR FORELINE SYSTEM

CROSS-REFERENCE OF RELATED APPLICATION

This application is a Section 371 National Stage Application of International Application No. PCT/GB2021/051898, filed Jul. 22, 2021, and published as WO 2022/018449A1 on Jan. 27, 2022, the content of which is hereby incorporated by reference in its entirety and which claims priority of British Application No. 2011483.1, filed Jul. 24, 2020.

FIELD

The present invention relates to a modular foreline system for forming a foreline for coupling a process chamber of a semiconductor fabrication plant to a vacuum pumping and/or abatement system.

BACKGROUND

Semiconductor fabrication plants fabricate integrated circuit chips. Many of the processes performed on silicon wafers, such as etch processes, involve the use of a gaseous ambient and often require the use of high vacuum and reduced gas pressures.

Vacuum pumps are used to provide these reduced gas pressures in process chambers, provide chamber evacuation, and maintain flows of processing gases.

Vacuum pumps are coupled to the process chambers by forelines.

The discussion above is merely provided for general background information and is not intended to be used as an aid in determining the scope of the claimed subject matter. The claimed subject matter is not limited to implementations that solve any or all disadvantages noted in the background.

SUMMARY

In an aspect there is provided a modular system of foreline components, which may be connected together to provide a foreline for a vacuum pumping system. The modular system allows forelines to be constructed from standard components.

In a first aspect, there is provided a kit of parts for forming a foreline for coupling a process chamber to a vacuum pumping and/or abatement system. The kit comprises a plurality of foreline segments. Each foreline segment is a pipe that comprises: a first substantially straight end portion; a second substantially straight end portion opposite to the first end portion; and an intermediate portion disposed between the first and second end portions and connected to the first and second end portions by respective bends. The first and second end portions are substantially parallel to each other. The intermediate portion is oblique to the first and second end portions. The foreline segments in the plurality of foreline segments are configured to be attached together so as to form a continuous foreline.

The first substantially straight end portion, the second substantially straight end portion, and the intermediate portion may be integrally formed.

Each foreline segment may be a pipe, conduit, or tube.

Each foreline segment may comprise a respective means for heating that foreline segment, such that heating of each foreline segment is independently controllable.

The kit of parts may further comprise one or more further foreline segments, each further foreline segment being a substantially straight pipe, wherein the further foreline segments are configured to be attached to the foreline segments, and to each other, so as to form a continuous foreline. Each further foreline segment may comprise a respective means for heating that further foreline segment, such that heating of each further foreline segment is independently controllable.

Each of the one or more further foreline segments may have a length greater than or equal to ten times a diameter of that further foreline segment.

The intermediate portion may have a length greater than or equal to ten times a diameter of that intermediate portion.

An angle between the first end portion and the intermediate portion may be between 30° and 60°. An angle between the second end portion and the intermediate portion may be between 30° and 60°. These angles may be the same. The angle(s) may be approximately 45°.

Each of the plurality of foreline segments may have a diameter selected from the range of diameters consisting of 40 mm, 63 mm, 80 mm, 100 mm, 160 mm, 200 mm, 250 mm, and 300 mm.

The kit of parts may further comprise one or more elements selected from the groups of elements consisting of: one or more traps configured to be attached to a respective foreline segment; one or more reactors configured to be mounted within a respective foreline segment; one or more bellows configured to be attached to an end of a respective foreline segment; and one or more filters configured to be coupled to a respective foreline segment.

For each foreline segment, a distal end of the first end portion may comprise a first flange. For each foreline segment, a distal end of the second end portion may comprise a second flange.

In a further aspect, there is provided a foreline comprising the coupled together plurality of foreline segments of the kit of parts of any preceding aspect.

The foreline may comprise exactly two foreline segments and exactly three substantially straight further foreline segments. The foreline segments and the further foreline segments may be alternatingly attached together.

In a further aspect, there is provided a system comprising a process chamber, a vacuum pumping and/or abatement system, and a foreline attached between the process chamber and the vacuum pumping and/or abatement system. The foreline is in accordance with any preceding aspect.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

DETAILED DESCRIPTION

Figure 1:
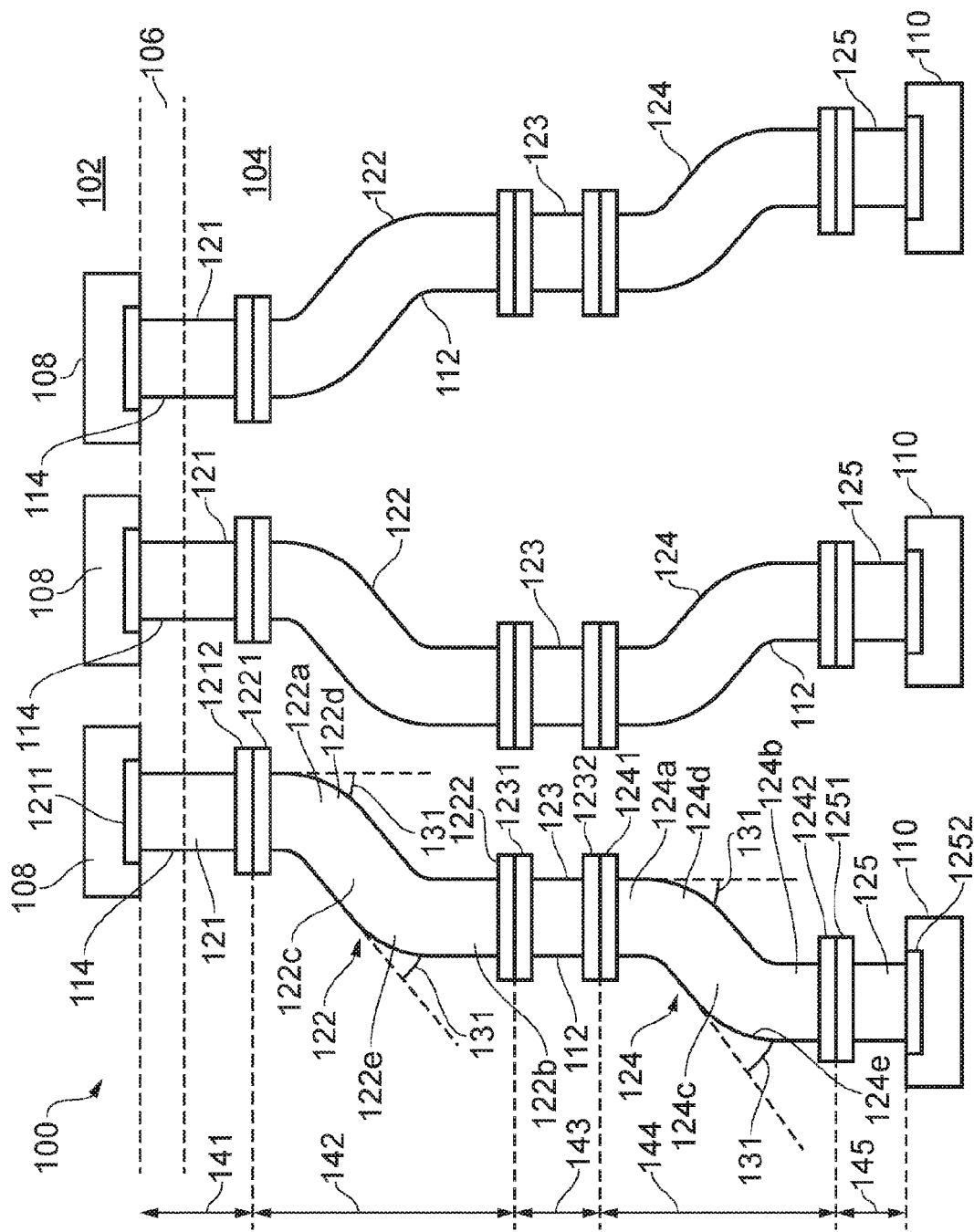
FIG. 1 is a schematic illustration (not to scale) showing a semiconductor fabrication plant comprising modular forelines connecting process chambers and vacuum pumping systems.

FIG. 1 is a schematic illustration (not to scale) showing a semiconductor fabrication plant 100, according to an embodiment.

The semiconductor fabrication plant 100 comprises a cleanroom 102 and a so-called subfab 104. The cleanroom 102 and the subfab 104 are separated by a structure 106 that forms a floor of the cleanroom 102 and a ceiling of the subfab 104.

The cleanroom 102 is a room in which semiconductor fabrication takes place. The air in the cleanroom 102 is maintained at typical clean room purity levels by an appropriate gas/air filtration and distribution system (not shown).

The cleanroom 102 comprises plurality of process chambers 108.

Each of the process chambers 108 is configured to receive a process gas from a process gas source (not shown) and, using the received process gas, perform an etch process to chemically remove layers from surfaces of wafers located within the process chamber 108.

The subfab 104 is located directly below the cleanroom 102. The subfab 104 may be a room in which is maintained an air cleanliness level greater than a predetermined threshold.

The subfab 104 comprises plurality of gas pumping stations 110.

In this embodiment, the gas pumping stations 110 comprise one or more vacuum pumps, and may additionally include abatement apparatus. Each gas pumping station 110 is coupled to a respective one of the process chambers 108 by means of a respective foreline, or suction line, 112.

Each foreline 112 extends between a respective gas pumping station 110 and process chamber 108 pair. Each foreline 112 passes through a respective opening 114 in the structure 106.

Each gas pumping station 110 is configured to evacuate and maintain controlled gas flows in the process chamber 108 coupled thereto. Each gas pumping station 110 is configured to pump, via its respective foreline 112, exhaust gases out the process chamber 108 coupled thereto. Each gas pumping station 110 may be further configured to dispose of said pumped exhaust gases.

In this embodiment, each foreline 112 is a modular foreline formed of a plurality of modules or modular components. In other words, each foreline 112 is formed from a kit of parts. In particular, in this embodiment, each foreline 112 comprises a plurality of foreline segments, namely a first foreline segment 121, a second foreline segment 122, a third foreline segment 123, a fourth foreline segment 124, and a fifth foreline segment 125.

Each of the foreline segments 121-125 comprises a respective pair of flanges, one at either end of that foreline segment 121-125. In particular, the first foreline segment 121 comprises a first flange 1211 at its first end and a second flange 1212 at its second end. The second foreline 122 segment comprises a first flange 1221 at its first end and a second flange 1222 at its second end. The third foreline 123 segment comprises a first flange 1231 at its first end and a second flange 1232 at its second end. The fourth foreline 124 segment comprises a first flange 1241 at its first end and a second flange 1242 at its second end. The fifth foreline 125 segment comprises a first flange 1251 at its first end and a second flange 1252 at its second end.

Each of the flanges surrounds a respective opening of the foreline segment.

The foreline segments 121-125 are connected together as follows. The first flange 1211 at the first end of the first foreline segment 121 is connected to a respective process chamber 108. The second flange 1212 at the second end of the first foreline segment 121 is connected to the first flange 1221 at the first end of the second foreline segment 122. The second flange 1222 at the second end of the second foreline segment 122 is connected to a first flange 1231 at the first end of the third foreline segment 123. The second flange 1232 at the second end of the third foreline segment 123 is connected to the first flange 1241 at the first end of the fourth foreline segment 124. The second flange 1242 at the second end of the fourth foreline segment 124 is connected to the first flange 1251 at the first end of the fifth foreline segment 125. The second flange 1252 at the second end of the fifth foreline segment 125 is connected to a respective gas pumping station 110. Connections between the connected together flanges may be provided, e.g. by bolts passing through those flanges.

The flanges 1221-1252 may be configured to provide vacuum compatible sealing between connected together foreline segments. The flanges 1221-1252 may be compatible with any appropriate standard, such as the ISO standard for flanges.

In this embodiment, the foreline segments 121-125 are configured such that the flanges 1221-1252 are substantially horizontal.

Each of the foreline segments 121-125 may be considered to be a pipe having a substantially circular cross section. The diameters of the foreline segments 121-125 may be substantially the same. The diameter of each foreline segment 121-125 may be between about 40 mm and 200 mm. For example, the diameter may be a standard ISO diameter of 40 mm, 63 mm, 80 mm, 100 mm, 160 mm, 200 mm, 250 mm, or 300 mm.

In this embodiment, the first, third, and fifth foreline segments 121, 123, 125 are substantially straight foreline segments, i.e. substantially straight pipes. The first, third, and fifth foreline segments 121, 123, 125 are arranged vertically.

The length of each of the first, third, and fifth foreline segments 121, 123, 125 is preferably greater than or equal to ten times its diameter. For example, a straight foreline segment having a diameter of about 100 mm may have a length of at least 1 m.

In this embodiment, the second and fourth foreline segments 122, 124 may be identical to one another. The second and fourth foreline segments 122, 124 are non-straight, i.e. bent foreline segments.

In particular, in this embodiment each of the second and fourth foreline segments 122, 124 comprises a first substantially straight end portion 122a, 124a, a second substantially straight end portion 122b, 124b opposite to the first end portion 122a, 124a, and an intermediate portion 122c, 124c disposed between the first end portion 122a, 124a and the second end portion 122b, 124b. The intermediate portion 122c, 124c is connected to the first end portion 122a, 124a by a first bend 122d, 124d. The intermediate portion 122c, 124c is connected to the second end portion 122b, 124b by a second bend 122e, 124e. The first end portion 122a, 124a and the second end portion 122b are substantially parallel to each other. The intermediate portion 122c, 124c is oblique to the first end portion 122a, 124a and the second end portion 122b, 124b.

The second and fourth foreline segments 122, 124 are positioned such that the first end portions 122a, 124a and the second end portions 122b, 124b are arranged vertically.

In this embodiment, the angles 131 between the end portions 122a, 124a, 122b, 124b and the intermediate portions 122c, 124c disposed therebetween may be an angle between about 30° and 60°. For example, the angle 131 any be about 30°, about 35°, about 40°, about 45°, about 50°, about 55°, or about 60°. More preferably, the angle 131 is 45°. In some embodiments, the angle 131 is between about 35° and 55°. In some embodiments, the angle 131 is between about 40° and 50°.

The length of each intermediate portion 122c, 124c is preferably greater than or equal to ten times its diameter. For example, for a straight intermediate portion having a diameter of about 100 mm may have a length of at least 1 m.

For the multiple forelines 112, the first foreline segments 121 of the forelines 112 may be substantially identical to one another. The second foreline segments 122 of the forelines 112 may be substantially identical to one another. The third foreline segments 123 of the forelines 112 may be substantially identical to one another. The fourth foreline segments 124 of the forelines 112 may be substantially identical to one another. The fifth foreline segments 125 of the forelines 112 may be substantially identical to one another.

In some embodiments, the first foreline segments 121 are substantially identical to the third foreline segments 122. In some embodiments, the first foreline segments 121 are substantially identical to the fifth foreline segments 125. In some embodiments, the second foreline segments 122 are substantially identical to the fourth foreline segments 124.

In this embodiment, each of the foreline segments 121-125 has a respective vertical length, or height. In particular, the first foreline segment 121 has a first vertical length 141, the second foreline segment 122 has a second vertical length 142, the third foreline segment 123 has a third vertical length 143, the fourth foreline segment 124 has a fourth vertical length 144, and the fifth foreline segment 125 has a fifth vertical length 145.

Preferably, the vertical lengths 141-145 of the foreline segments 121-125 are all equal to a respective integer multiple of a common value D, where D may take any appropriate value. The value D may be, for example, a value in the range 10 mm-200 cm, or more preferably 10 mm-100 cm, or more preferably 10 mm-90 cm, or more preferably 10 mm-50 cm, or more preferably 10 mm-20 cm, or more preferably 10 mm-10 cm, or more preferably 10 mm-5 cm, or more preferably 20 mm-50 mm, or more preferably 30 mm-40 mm. Example x values include, but are not limited to, 10 mm, 11 mm, 22 mm, 40 mm, 41 mm, 42 mm, 43 mm, 44 mm, 45 mm, 46 mm, 47 mm, 48 mm, 49 mm, 50 mm, 88 mm, 176 mm, 352 mm, 704 mm, 11 cm, 22 cm, 100 cm, 175 cm, 200 cm, etc. Preferably, D is equal to 44 mm or about 44 mm. The exact value chosen for D tends not to be critical and any appropriate value can be chosen.

In some embodiments, the vertical lengths 141-145 of the foreline segments 121-125 are all equal, e.g. equal to x. Thus, the vertical height of a foreline 112 is 5 x. The height x may be any appropriate value, e.g. 1 m.

In some embodiments, the vertical lengths 141-145 of the foreline segments 121-125 are not all equal. For example, the first, third, and fifth segments 121, 123, 125 may have a vertical height of x, while the second and fourth segments 122, 124 may have a vertical height of y, where y is not equal to x. The vertical height of a foreline 112 is then 3x+2y. The height x may be any appropriate value. The height y may be any appropriate value.

In this embodiment, each foreline 112 is may be considered to be a modular pipe or conduit comprising alternating straight sections and non-straight sections, which are detachably attached together. There are three straight sections and two non-straight sections in each foreline 112.

Each foreline 112 is a pipe comprising a plurality of bends. Preferably, the bends are swept bends having angles such as those described above, as opposed to sharp bends.

Figure 2:
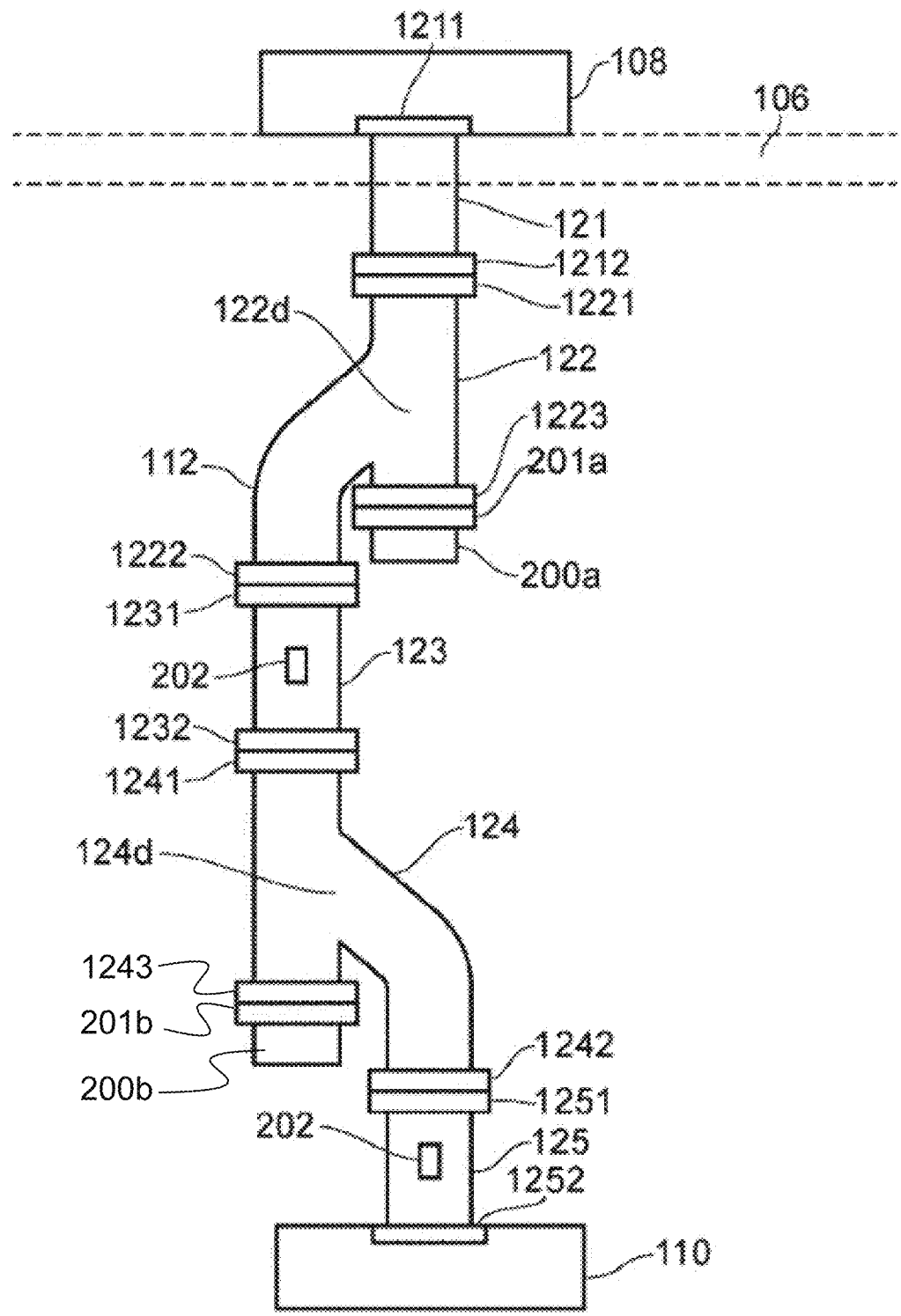
FIG. 2 is a schematic illustration (not to scale) showing an alternative modular foreline connecting a process chamber and a vacuum pumping system.

FIG. 2 is a schematic illustration (not to scale) showing an alternative modular foreline connecting a process chamber and a vacuum pumping system. In FIG. 2, elements that are the same as those shown in FIG. 1 and described in more detail earlier above are indicated using the same reference numerals as those of FIG. 1, and will not be described again for the sake of brevity.

In this embodiment, the modular foreline 112 further comprises a plurality of traps 200 and a plurality of in-line reactors 202. Thus, the kit of parts from which a foreline 112 is constructed additionally comprises, in this embodiment, a plurality of traps 200a,b and a plurality of reactors 202.

The traps 200a,b may be devices that capture gases and vapours from the exhaust gas being pumped through the foreline 112. The traps 200a,b may be any appropriate type of traps, including but not limited to ambient alumna traps.

The traps 200a,b are modular elements which are attachable and detachable from the foreline sections 121-125. The traps 200a,b may be configured to attach to the foreline sections at any appropriate position.

In this embodiment, a first trap 200a is connected to the second foreline segment 122. In particular, in this embodiment, the second foreline segment 122 further comprises a further opening surrounded by a third flange 1223 (not present in the embodiment shown in FIG. 1). The third flange 1223 is located at the first bend 122d of the second foreline segment 122, opposite to and vertically below the first flange 1221. The first trap 200a comprises a flange 201a which is connected to, e.g. by bolts, third flange 1223.

Similarly, in this embodiment, a second trap 200b is connected to the fourth foreline segment 124. In particular, in this embodiment, the fourth foreline segment 124 further comprises a further opening surrounded by a third flange 1243 (not present in the embodiment shown in FIG. 1). The third flange 1243 is located at the first bend 124d of the fourth foreline segment 124, opposite to and vertically below the first flange 1241. The second trap 200b comprises a flange 201b which is connected to, e.g. by bolts, third flange 1243.

The traps 200a,b may include valves, e.g. for maintenance.

The reactors 202 may be any appropriate type of reactors for treating an exhaust gas in the foreline, for example foreline plasma reactors.

The reactors 202 are modular elements which are attachable and detachable from the foreline sections 121-125. The reactors 202 may be mountable within the foreline sections 121-125. In this embodiment, the reactors 202 are positioned within straight portions of foreline sections, specifically within the third and fifth foreline sections 123, 125.

Thus, a modular system for constructing a foreline of a vacuum pumping system is provided.

Advantageously, the modules (i.e. the foreline subsections, and ancillary devices) can be easily and efficiently arranged and attached together to provide multiple different system configurations. Multiple different example configurations are shown in FIG. 1. This advantageously allows a degree of flexibility and control in the positioning of the gas pumping systems with respect to one another, and with respect to the process chambers. For example, using the above-described system it tends to be possible to space apart the gas pumping systems to a greater extent than compared to, say, using straight forelines. This tends to make maintenance and repair of the gas pumping systems easier.

The modules can be manufactured and prepared in advance of the system being designed and installed, thereby reducing cost and lead time.

The space (or footprint) occupied by an installed vacuum pumping and/or abatement system tends to be an important factor in system design. A reduced footprint tends to lead to decreased costs and/or greater productivity. Advantageously, with the above-described modular system, greater control of the footprint of the installed system tends to be provided.

The above-described modular system tends to speed-up manufacture and installation of forelines in semiconductor fabrication plants. The modular system is a kit of parts comprising a plurality of pipes, each pipe having a standard length and diameter. The kit may allow for multiple forelines to be constructed, each of the forelines having a different shape or configuration, while still having the same number of bends and straight sections as the other forelines. Thus, the differently configured/differently shaped forelines tend to provide substantially the same vacuum performance as each other. This tends to facilitate chamber matching, i.e. the matching of performance between multiple different process chambers.

Conventionally, having highly variable bespoke forelines tend to make installing Temperature Management Systems (TMS) difficult. Also, consistent quality control of bespoke forelines tends to be difficult to guarantee. The above-described modular foreline system tends to address these problems.

The above-described modular foreline system tends to provide consistent geometry and conductance to each process chamber, support variation in fab/subfab layout, incorporate standardized interfaces and size (diameter and length) increments, facilitate the inclusion of integrated TMS with measurement, allow for the inclusion of foreline traps/deadlegs, facilitate foreline cleaning, repair, and maintenance, and support fitment of instrumentation and leak testing.

In the above embodiments, the modular foreline system, i.e. the kit of parts, comprises a plurality of straight segments (e.g. the first, third, and fifth segments) and a plurality of segments comprising multiple bends (e.g. the second and fourth segments). However, in other embodiments, the kit comprises different parts. In some embodiment, the straight segments may be omitted. In some embodiments, differently shaped segments may be included, for example segments having only a single bend may be included.

In the above embodiments, each foreline comprises exactly three straight segments and exactly two segments comprising multiple bends, which are alternatingly attached together. However, in other embodiments, each foreline comprises a different number of straight segments (e.g. none, less than three, more than 3) and/or a different number of segments comprising multiple bends (e.g. one, more than two). The segments that make up the foreline may be attached together in a different configuration, e.g. not the alternating arrangement shown in FIGS. 1 and 2.

In the above embodiments, the foreline segments of the modular system are unheated, i.e. they are not provided with respective heating means for heating a gas flowing through that segment. However, in other embodiments one or more or, and more preferably all of, the foreline segments of the modular system are heated, i.e. include respective heating means for heating a gas flowing through that segment. Examples of heating means include, but are not limited to, jackets that may be wrapped around a pipe segment and controlled so as to heat that pipe segment. Preferably, the respective heating means are independently controllable from one another. Thus, an assembled foreline comprises multiple independently controllable heating zones along its length.

In certain above embodiments, modular foreline system, i.e. the kit of parts, comprises one or more traps and one or more reactors. In some embodiments, traps are omitted, in some embodiments, reactors are omitted. In other embodiments, the modular foreline system comprises one or more different types of device instead of or in addition to the traps and/or reactors. Examples of different types of devices that may be included in the kit include, but are not limited to, filters (such as in-line filters for mounting within a segment), a bellows portion for providing a variable length attachment between devices/segments, temperature sensors, pressure sensors, heating control device, a temperature management system, etc.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A kit of parts for forming a foreline for coupling a process chamber to a vacuum pumping and/or abatement system, the kit comprising:
a plurality of foreline segments; wherein
each foreline segment is a pipe that comprises:
a first substantially straight end portion;
a second substantially straight end portion opposite to the first end portion; and
an intermediate portion disposed between the first and second end portions and connected to the first and second end portions by respective bends;
the first and second end portions are substantially parallel to each other;
the intermediate portion is oblique to the first and second end portions;
the foreline segments in the plurality of foreline segments are configured to be attached together so as to form a continuous foreline; and
at least one foreline segment of the plurality of foreline segments comprises a means for heating a gas flowing through the at least one foreline segment.

2. The kit of parts of claim 1, wherein each foreline segment comprises a respective means for heating that foreline segment, such that heating of each foreline segment is independently controllable.

3. The kit of parts of claim 1, further comprising one or more further foreline segments, each further foreline segment being a substantially straight pipe, wherein the further foreline segments are configured to be attached to the foreline segments, and to each other, so as to form a continuous foreline.

4. The kit of parts of claim 3, wherein each further foreline segment comprises a respective means for heating that further foreline segment, such that heating of each further foreline segment is independently controllable.

5. The kit of parts of claim 3, wherein each of the one or more further foreline segments has a length greater than or equal to ten times a diameter of that further foreline segment.

6. The kit of parts of claim 1, wherein the intermediate portion has a length greater than or equal to ten times a diameter of that intermediate portion.

7. The kit of parts of claim 1, wherein:
an angle between the first end portion and the intermediate portion, and an angle between the second end portion and the intermediate portion is between 30° and 60°.

8. The kit of parts of claim 7, wherein the angle is approximately 45°.

9. The kit of parts of claim 1, wherein each of the plurality of foreline segments has a diameter selected from the range of diameters consisting of 40 mm, 63 mm, 80 mm, 100 mm, 160 mm, 200 mm, 250 mm, and 300 mm.

10. The kit of parts of claim 1, further comprising one or more elements selected from the groups of elements consisting of:
one or more traps configured to be attached to a respective foreline segment;
one or more reactors configured to be mounted within a respective foreline segment;
one or more bellows configured to be attached to an end of a respective foreline segment; and
one or more filters configured to be coupled to a respective foreline segment.

11. The kit of parts of claim 1, wherein, for each foreline segment, a distal end of the first end portion comprises a first flange, and a distal end of the second end portion comprises a second flange.

12. A foreline comprising the coupled together plurality of foreline segments of the kit of parts of claim 1.

13. The foreline of claim 12, wherein each foreline segment comprises a respective means for heating that foreline segment, such that heating of each foreline segment is independently controllable wherein the foreline comprises exactly two foreline segments and exactly three substantially straight further foreline segments.

14. The foreline of claim 13, wherein the foreline segments and the further foreline segments are alternatingly attached together.

15. A system comprising:
a process chamber;
a vacuum pumping and/or abatement system; and
a foreline attached between the process chamber and the vacuum pumping and/or abatement system; wherein the foreline is in accordance with claim 12.

* * * * *